(12) United States Patent
Chae et al.

(10) Patent No.: US 6,879,533 B2
(45) Date of Patent: Apr. 12, 2005

(54) INTEGRATED CIRCUIT MEMORY DEVICES INCLUDING ACTIVE LOAD CIRCUITS AND RELATED METHODS

(75) Inventors: Moo-sung Chae, Seoul (KR); Myeong-o Kim, Seoul (KR); Sung-min Seo, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 41 days.

(21) Appl. No.: 10/609,071

(22) Filed: Jun. 27, 2003

(65) Prior Publication Data

US 2004/0052140 A1 Mar. 18, 2004

(30) Foreign Application Priority Data

Sep. 17, 2002 (KR) .................... 10-2002-0056622

(51) Int. Cl.[7] .................................................. G11C 7/00
(52) U.S. Cl. ...................... 365/205; 365/190; 365/203
(58) Field of Search ................................. 365/205, 190, 365/203, 207, 63

(56) References Cited

U.S. PATENT DOCUMENTS 6,452,851 B1 * 9/2002 Endo et al. ................. 365/205

* cited by examiner

*Primary Examiner*—David Lam
(74) *Attorney, Agent, or Firm*—Myers Bigel Sibley & Sajovec (57) ABSTRACT

An integrated circuit memory device can include a memory cell array having a plurality of memory cells, and a bit line sense amplifier configured to amplify data on a pair of bit lines from a memory cell of the memory cell array and to provide the amplified data on a data line and a complementary data line. An active load circuit includes a first load device electrically connected between the data line and a voltage source wherein an electrical resistance of the first load device is varied responsive to a voltage level of the data line. The active load circuit also includes a second load device electrically connected between the complementary data line and the voltage source wherein an electrical resistance of the second load device is varied responsive to a voltage level of the complementary data line. Related methods are also discussed.

24 Claims, 4 Drawing Sheets

FIG. 5

INTEGRATED CIRCUIT MEMORY DEVICES INCLUDING ACTIVE LOAD CIRCUITS AND RELATED METHODS

RELATED APPLICATIONS

This application claims priority from Korean Patent Application No. 2002-56622, filed Sep. 17, 2002, in the Korean Intellectual Property Office, the disclosure of which is incorporated herein in its entirety by reference.

BACKGROUND OF THE INVENTION

1. Field of the Invention

The present invention relates to integrated circuits, and more particularly, to integrated circuits including bit line sense amplifiers and related methods.

2. Description of the Related Art

In a dynamic random access memory (DRAM), a current sense amplifier is generally used to read out information that is sensed by a bit line sense amplifier. The current sense amplifier can sense faster than a voltage sense amplifier, so the current sense amplifiers are more widely used. The current sense amplifier senses a current signal input through a transmission line, amplifies the current signal, and outputs the current signal as a voltage signal. The current sense amplifier may be required to effectively receive the current signal through the transmission line so that data from the transmission line can be properly sensed.

Conventionally, an operating point of a current sense circuit can be determined using a passive load circuit. Because the passive load circuit may have a relatively low input resistance, however, loss of the current signal may occur, and the data may not be properly sensed.

To reduce loss of the current signal, the input resistance of the passive load circuit may be increased. If the input resistance of the passive load circuit increases, however, the data may be transmitted more slowly. This problem may worsen as a transmission line length increases and a distance between the current sense circuit and a load resistance increases. In an attempt to address this problem, it has been suggested that the operating point of the current sense circuit be determined using an ideal current source. This suggestion, however, may have the disadvantage that the circuit may become very large and difficult to control.

Figure 1:
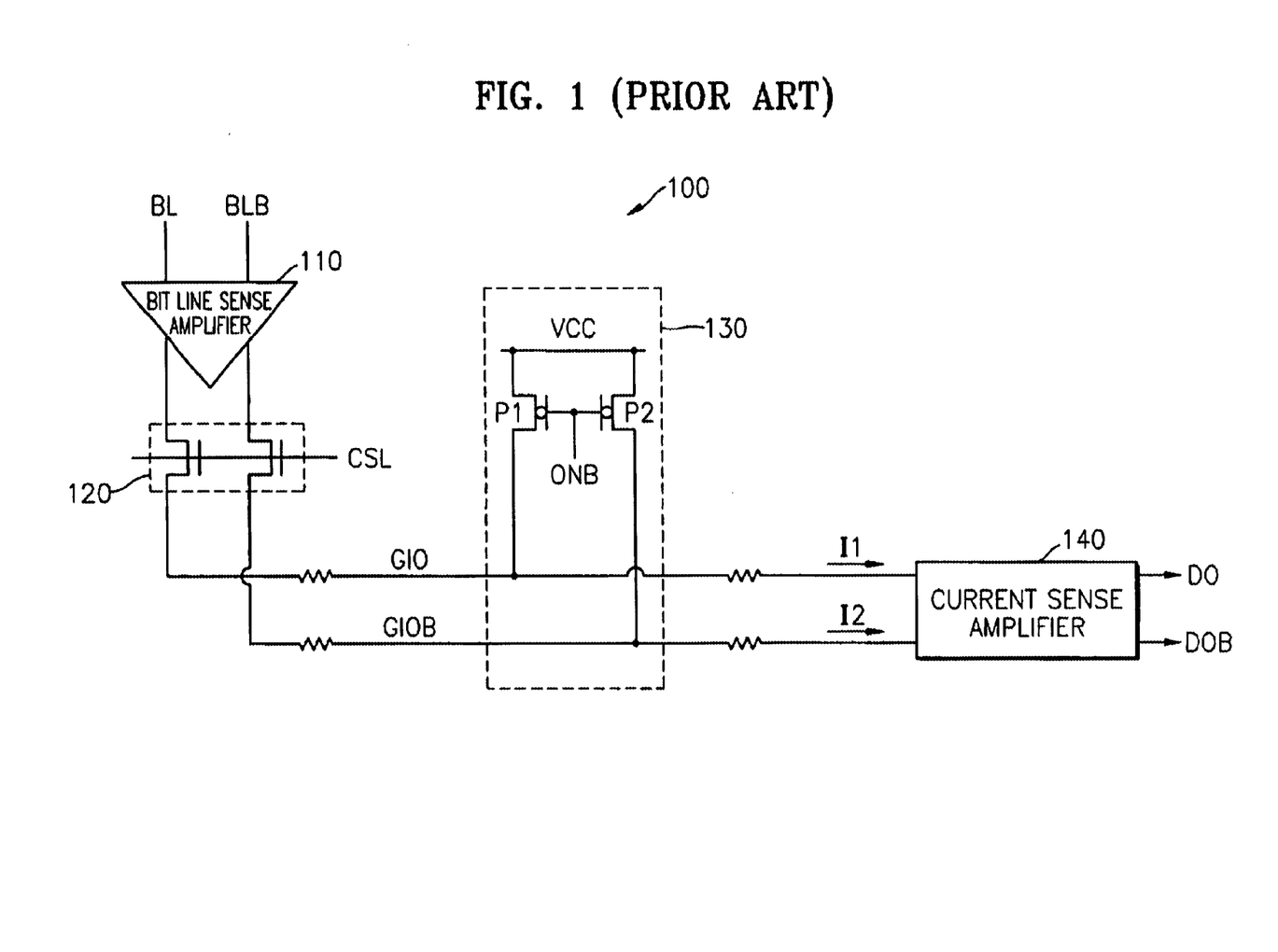
FIG. 1 is a circuit diagram of a semiconductor memory device having a conventional passive load circuit.

FIG. 1 is a circuit diagram of a semiconductor memory device including a conventional passive load circuit. A passive load circuit 130 is connected to a pair of data lines GIO and GIOB. Data, which is sensed and amplified by a bit line sense amplifier 110, is transmitted to a current sense amplifier 140 through transmission lines, i.e., the pair of data lines GIO and GIOB. If a transmission gate 120 is turned on using a column selection line CSL, the data which is sensed by the bit line sense amplifier 110 is loaded to the pair of data lines GIO and GIOB, and a small change in the current signal occurs in the pair of data lines GIO and GIOB. The current sense amplifier 140 senses and amplifies changes of current signals I1 and I2 and generates output voltages DO and DOB responsive to the current signals I1 and I1.

The conventional passive load circuit 130 includes a first PMOS transistor P1 and a second PMOS transistor P2. The first PMOS transistor P1 is connected between a supply voltage VCC and the data line GIO. The second PMOS transistor P2 is connected between the supply voltage VCC and the complementary data line GIOB. The first and second PMOS transistors P1 and P2 are turned on/off using a supplementary enable signal ONB. Therefore, the first and second PMOS transistors P1 and P2 are turned on when an enable signal (i.e., the supplementary data enable signal ONB) is at a logic "low" level. Since the voltage level of the supplementary data enable signal ONB is constant at the logic "low" level, turn-on resistances of the first and second PMOS transistors P1 and P2 are constant. Thus, the first and second transistors P1 and P2 may function as passive elements having relatively constant resistances.

If data sensed by the bit line sense amplifier 110 is equal to 0, and the transmission gate 120 is turned on, the voltage level of the data line GIO will decrease. Moreover, a small change occurs in the current signal of the data line GIO. As the voltage level of the data line GIO decreases, a voltage loaded across the first PMOS transistor P1 increases, and thus a capacity of current flowing from the supply voltage VCC through the first PMOS transistor P1 to the data line GIO may increase. Accordingly, the change in the current signal I1 that flows into the current sense amplifier 140 decreases. That is, losses of the current signals I1 and I2, which flow into the current sense amplifier 140, may be incurred. The current sense amplifier 140 may thus be unable to properly sense the data.

SUMMARY OF THE INVENTION

According to embodiments of the present invention, an integrated circuit memory device may include a memory cell array having a plurality of memory cells, and a bit line sense amplifier configured to amplify data on a pair of bit lines from a memory cell of the memory cell array and to provide the amplified data on a data line and a complementary data line. An active load circuit includes a first load device electrically connected between the data line and a voltage source wherein an electrical resistance of the first load device is varied responsive to a voltage level of the data line. The active load circuit also includes a second load device electrically connected between the complementary data line and the voltage source wherein an electrical resistance of the second load device is varied responsive to a voltage level of the complementary data line.

More particularly, the electrical resistance of the first load device may increase as the voltage level of the data line decreases, and the electrical resistance of the second load device may increase as the voltage level of the complementary data line decreases. Similarly, the electrical resistance of the first load device may decrease as the voltage level of the data line increases, and the electrical resistance of the second load device may decrease as the voltage level of the complementary data line increases.

The first load device may include a first load transistor connected between the data line and the voltage source, and the second load device may include a second load transistor connected between the complementary data line and the voltage source. The active load circuit may further include a first control transistor configured to generate a first control signal responsive to the voltage level of the data line and a second control transistor configured to generate a second control signal responsive to the voltage level of the complementary data line. The first control signal can be applied to a gate of the first load transistor, and the second control signal can be applied to a gate of the second load transistor.

The active load circuit may also include a first diode connected between the complementary data line and the first control transistor and a second diode connected between the data line and the second control transistor. More particularly, the first and second diodes may be respective first and second diode connected MOS transistors. In addition, the first and second load devices may be respective PMOS transistors. The first control transistor can be connected between the gate of the first load transistor and a common node with a gate connected to the data line, and the second control transistor can be connected between the gate of the second load transistor and the common node with a gate connected to the complementary data line. Moreover, the first and second control transistors can be respective first and second NMOS transistors.

The active load circuit may also include an operation control transistor connected between the common node and a second voltage source wherein the operation control transistor is configured to turn on responsive to an activated enable signal and to turn off responsive to a deactivated enable signal. In addition, a precharge device can be configured to precharge the first and second control signals to the first voltage source responsive to the deactivated enable signal. This precharge device may include a first precharge transistor connected between the first voltage source and the gate of the first load transistor with a gate receiving the enable signal and a second precharge transistor connected between the first voltage source and the gate of the second load transistor with a gate receiving the enable signal. More particularly, the first voltage source may include a supply voltage, and the second voltage source may include a ground voltage.

The memory device may also include a current sense amplifier configured to amplify data from the data line and the complementary data line. In addition, the memory device may include transmission gates on the pair of complementary data lines configured to couple the bit line sense amplifier to the active load circuit responsive to an enabled selection signal and to decouple the bit line sense amplifier from the active load circuit responsive to a disabled selection signal.

According to additional embodiments of the present invention, methods may be provided of operating integrated circuit memory devices including an array of memory cells and a bit line sense amplifier configured to amplify data on a pair of bit lines from a memory cell of the array and to provide the amplified data on a data line and a complementary data line. In particular, an electrical resistance between the data line and a voltage source may be varied responsive to a voltage level of the data line, and an electrical resistance between the complementary data line and the voltage source may be varied responsive to a voltage level of the complementary data line.

More particularly, varying the electrical resistance between the data line and the voltage source may include increasing the electrical resistance between the data line and the voltage source as the voltage level of the data line decreases. Similarly, varying the electrical resistance between the complementary data line and the voltage source may include increasing the electrical resistance between the complementary data line and the voltage source as the voltage level of the complementary data line decreases. In addition, varying the electrical resistance between the data line and the voltage source may include decreasing the electrical resistance between the data line and the voltage source as the voltage level of the data line increases, and varying the electrical resistance between the complementary data line and the voltage source may include decreasing the electrical resistance between the complementary data line and the voltage source as the voltage level of the complementary data line increases.

Varying the electrical resistance between the data line and the voltage source may also include generating a first control signal responsive to the voltage level of the data line with the electrical resistance between the data line and the voltage source being varied responsive to the first control signal. Similarly, varying the electrical resistance between the complementary data line and the voltage source may include generating a second control signal responsive to the voltage level of the complementary data line with the electrical resistance between the complementary data line and the voltage source being varied responsive to the second control signal. In addition, the first and second control signals can be precharged to a voltage level of the voltage source responsive to a deactivated enable signal.

Data from the data line and the complementary data line can also be amplified. In addition, the bit line sense amplifier can be coupled to the data line and the complementary data line responsive to an enabled selection signal, and the bit line sense amplifier can be decoupled from the data line and the complementary data line responsive to a disabled selection signal.

DETAILED DESCRIPTION OF THE INVENTION

The present invention will be described more fully hereinafter with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

Figure 2:
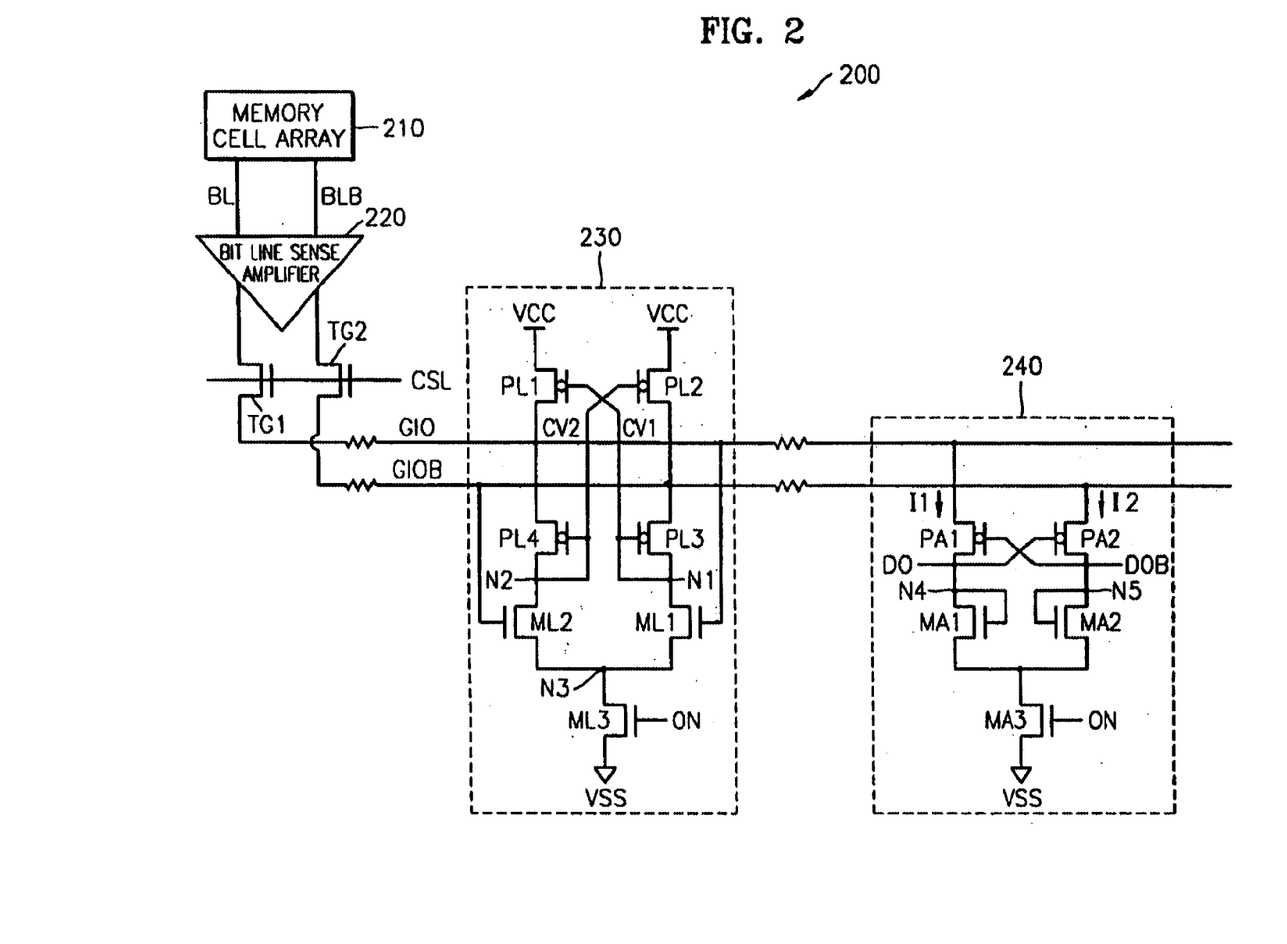
FIG. 2 is a circuit diagram of a semiconductor memory device having an active load circuit according to first embodiments of the present invention.

FIG. 2 is a circuit diagram of a semiconductor memory device 200 including an active load circuit 230 according to first embodiments of the present invention. Referring to FIG. 2, the semiconductor memory device 200 includes a memory cell array 210, a bit line sense amplifier 220, a pair of data lines GIO and GIOB, the active load circuit 230, and a current sense amplifier 240. The memory cell array 210 includes a plurality of rows and columns of memory cells.

The bit line sense amplifier 220 senses and amplifies data output through a pair of bit lines BL and BLB from the memory cell array 210. The data, which is sensed and amplified by the bit line sense amplifier 220, is transmitted to the pair of data lines GIO and GIOB through transmission gates TG1 and TG2. The transmission gates TG1 and TG2 are turned on/off in response to a column selection line CSL. The data, which is sensed and amplified by the bit line sense amplifier 220, is transmitted through transmission lines, i.e., the pair of data lines GIO and GIOB.

The current sense amplifier 240 is connected to the pair of data lines GIO and GIOB to sense and amplify the data that is output from the bit line sense amplifier 220. The active load circuit 230 is connected to the pair of data lines GIO and GIOB to determine an operating point of the current sense amplifier 240. More specifically, the active load circuit 230 includes a first load device PL1, a second load device PL2, a first control transistor ML1, a second control transistor ML2, a first diode PL3, a second diode PL4, and an operation control transistor ML3.

The first load device PL1 is electrically connected to the data line GIO, and its current capacity can be controlled in response to the voltage level of the data line GIO. The second load device PL2 is electrically connected to the complementary data line GIOB, and its current capacity can be controlled in response to the voltage level of the supplementary data line GIOB. The first load device PL1 can be a PMOS transistor having a source connected to the supply voltage VCC, a drain connected to the data line GIO, and gate receiving a first control signal CV1. The second load device PL2 can be a PMOS transistor having a source connected to the source voltage VCC, a drain connected to the complementary data line GIOB, and a gate receiving a second control signal CV2.

The first control transistor ML1 generates a first control signal CV1 for controlling the first load device PL1 in response to the voltage level of the data line GIO. A second control transistor ML2 generates a second control signal CV2 for controlling the second load device PL2 in response to the voltage level of the complementary data line GIOB. The first control transistor ML1 is an NMOS transistor having a gate connected to the data line GIO, a drain connected to a gate node N1 of the first load device PL1, and a source connected to a common node N3. The second control transistor ML2 is an NMOS transistor having a gate connected to the complementary data line GIOB, a drain connected to a gate node N2 of the second load device PL2, and a source connected to the common node N3.

If the voltage level of the data line GIO decreases, the voltage level of the first control signal CV1 increases. Thus, a turn-on resistance of the first load device PL1 increases, so a capacity of current flowing through the first load device PL1 may decrease. In the conventional passive load circuit 130 of FIG.1, if the voltage level of the data line GIO decreases, a capacity of current flowing through the first load device PL1 may increase. If the voltage of the supplementary data line GIOB decreases, the voltage level of the second control signal CV2 increases. Thus, a turn-on resistance of the second load device PL2 increases, so that a capacity of current flowing through the second load device PL2 may decrease.

The first diode PL3 is connected between the complementary data line GIOB and the first control transistor ML1 and reduces the voltage of the first control signal CV1 to be equal to a level calculated by subtracting a threshold voltage level of the first diode PL3 from the voltage level of the complementary data line GIOB. The second diode PL4 is connected between the data line GIO and the second control transistor ML2 and reduces the voltage of the second control signal CV2 to be equal to a level calculated by subtracting a threshold voltage level of the second diode PL4 from the voltage level of the data line GIO.

The voltage levels of the pair of data lines GIO and GIOB are similar to the level of the supply voltage VCC. Therefore, the first and second diodes PL3 and PL4 control the voltage levels of the first and second control signals CV1 and CV2 to be lower than each of the voltage levels calculated by subtracting the threshold voltage of each diode from the supply voltage VCC so that the first and second load devices PL1 and PL2 can continue to be turned on.

The first diode PL3, is a PMOS transistor with a source connected to the complementary data line GIOB and a gate and a drain connected to the gate node N1 of the first load device PL1. The second diode PL4 is a second diode with a source connected to the data line GIO, and a gate and a drain connected to the gate node N2 of the second load device PL2.

The operation control transistor ML3 turns on/off overall operations of the active load circuit 230 in response to the enable signal ON. If the enable signal ON is activated, the operation control transistor ML3 is turned on in response to the activation of the enable signal ON, and thus the active load circuit 230 begins to operate. The control transistor ML3 is an NMOS transistor having a drain connected to the common node N3, a source connected to a ground voltage VSS, and a gate receiving the enable signal ON.

The current sense amplifier 240 is connected to the pair of data lines GIO and GIOB to sense and amplify the data that is output from the bit line sense amplifier 220. More particularly, the current sense amplifier 240 includes a first sensing transistor PA1, a second sensing transistor PA2, load transistors MA1 and MA2 which function as load resistances, and a switching transistor MA3. Here, the first and second sensing transistors PA1 and PA2 are PMOS transistors, and the load transistors MA1 and MA2 and the switching transistor MA3 are NMOS transistors.

The first and second sensing transistors PA1 and PA2 have a latch structure and are cross-coupled to each other such that the drain of the first sensing transistor PA1 is connected to the gate of the second sensing transistor PA2 and the drain of the second sensing transistor PA2 is connected to the gate of the first sensing transistor PA1. The drains of the first and second sensing transistors PA1 and PA2 are additionally connected to output node N4 and inverted output node N5 respectively. An output voltage DO is output from the output node N4, and an inverted output voltage DOB is output from the inverted output node N5. The load transistors MA1 and MA2 are connected as diodes with drains connected to their respective gates and have the same resistance. The switching transistor MA3 is turned on/off using the enable signal ON. That is, the switching transistor MA3 is turned on in response to activation of the enable signal ON, thus causing the current sense amplifier 240 to begin operating.

The current sense amplifier 240 senses a difference in the levels of the current signals that are transmitted through the pair of data lines GIO and GIOB and amplifies the difference. If the data loaded to the data line GIO is equal to '0' and thus the voltage level of the data line GIO becomes lower than the voltage level of the complementary data line GIOB, the current signal I1 which flows into the first sensing transistor PA1 decreases. Thus, a difference in the levels of the current signals I1 and I2 results. Since the load transistors MA1 and MA2 have the same resistance, a difference in the voltages loaded to the load transistors MA1 and MA2 results. That is, the voltage level of the output node N4 becomes lower than the voltage level of the inverted output node N5. Since the output node DO and the inverted output node DOB are cross connected to the first and second sensing transistors PA1 and PA2, the difference in the voltage levels of the output node N4 and the inverted output node N5 is amplified by the first and second sensing transistors PA1 and PA2.

Accordingly, a change in current through the pairs of the data lines GIO and GIOB according to the data output from the bit line sense amplifier 220 can be sent to the current sense amplifier 240 with reduced loss of data on the change in current so that the current sense amplifier 240 can adequately sense and amplify the data. If data of the change of the current is lost during transmission to the current sense amplifier 240, the current sense amplifier 240 may not adequately sense the current signal, and reliability of the sensed data may decrease.

The active load circuit 230 according to first embodiments of the present invention controls a resistance in response to the voltage levels of the pair of the data lines GIO and GIOB to efficiently transmit the changes in the current signals of the data lines GIO and GIOB to the current sense amplifier 240 with reduced loss of data.

Operations of the semiconductor memory device will now be described with reference to FIG. 2. As the column selection line CSL is activated, the transmission gates TG1 and TG2 are turned on. Thus, the data, which is sensed by the bit line sense amplifier 220, is loaded to the pair of data lines GIO and GIOB. The data is presumed to be equal to '0'. If the data is equal to '0', the voltage level of the data line GIO decreases, and the resistance of the first control transistor ML1 (which is controlled by the voltage level of the data line GIO) increases. Therefore, the voltage level of the first control signal CV1 increases, and thus the resistance of the first load device PL1 that is controlled by the first control signal CV1 increases. Accordingly, the capacity of current flowing into the data line GIO from the supply voltage VCC may decrease.

That is, if the voltage level of the data line GIO decreases, the resistance of the first load device PL1 between the supply voltage VCC and the data line GIO increases, and thus the capacity of the current flowing into the data line GIO from the supply voltage VCC through the first load device PL1 may decrease. Therefore, changes in the current signal of the data line GIO are reflected in the current signal I1, which will be transmitted to the current sense amplifier 240, with reduced loss of data on changes in the current signal.

In the case when the data, which is sensed by the bit line sense amplifier 220, is equal to '1', the active load circuit 240 may reduce loss of data on changes in the current signal in the same manner as described above. When the data is equal to '1', the voltage of the complementary data line GIOB decreases, and the voltage resistance of the second control transistor ML2 increases. Therefore, the voltage level of the second control signal CV2 increases. Also, the resistance of the second load device PL2 which is controlled by the second control signal CV2 increases, and a capacity of current flowing from the supply voltage VCC to the complementary data line GIOB may decrease.

That is, if the voltage level of the complementary data line GIOB decreases, the resistance of the second load device PL2 between the supply voltage VCC and the supplementary data line GIOB increases, so that a capacity of current flowing into the complementary data line GIOB from the supply voltage VCC through the second load device PL2 may decrease. Therefore, the changes in the current signal of the complementary data line GIOB are reflected in the current signal I2 that is transmitted to the current sense amplifier 240, with reduced loss of data on changes in the current signal.

As described above, in the active load circuit 230 according to embodiments of the present invention, the small current signal loaded to the pairs of data lines GIO and GIOB from the bit line sense amplifier 220 can be transmitted to the current sense amplifier with reduced loss of data on the small current signal, so that the current sense amplifier 240 can adequately sense the data.

Figure 3:
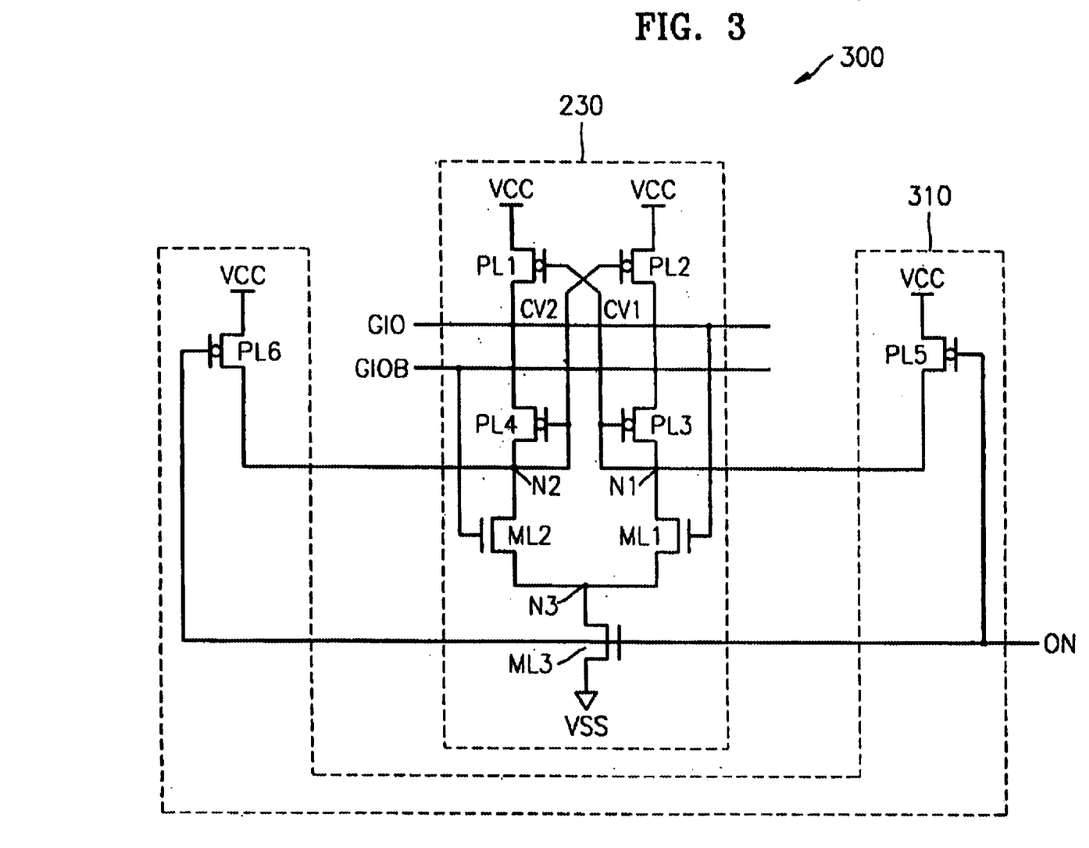
FIG. 3 is a circuit diagram of a semiconductor memory device having an active load circuit according to second embodiments of the present invention

FIG. 3 is a circuit diagram of an active load circuit 300 according to second embodiments of the present invention. Referring to FIG. 3, the active load circuit 300 further includes a precharge device 310 in addition to the active load circuit 230 of the first embodiments of the present invention. Accordingly, structures that are the same in the active load circuit 300 of this embodiment as those of the active load circuit 230 of FIG. 2 will not be described below.

The precharge device 310 precharges the first and second control signals CV1 and CV2 to a first voltage level (here, a logic high level) when the active load circuit 230 is turned off. More particularly, the precharge device 310 includes a first precharge transistor PL5 and a second precharge transistor PL6 which precharge the first control signal CV1 and the second control signal CV2, respectively, in response to the enable signal ON.

The first precharge transistor PL5 is a PMOS transistor having a source connected to the supply voltage VCC, a drain connected to the gate node N1 of the first load device PL1, and a gate receiving the enable signal ON. The precharge transistor PL6 is a PMOS transistor having a source connected to the supply voltage, a drain connected to the gate node N2 of the second load device PL2, and a gate receiving the enable signal ON.

The first and second precharge transistors PL5 and PL6 are turned on when the enable signal ON is deactivated to a low level and thus charges the voltage of the first and second control signals CV1 and CV2 to a logic "high" level. Thus, the first and second load devices PL1 and PL2, which are controlled by the first and second control signals CV1 and CV2, are turned off. That is, when the active load circuit 230 is turned off in response to the deactivation of the enable signal ON, the first and second load devices PL1 and PL2 are turned off by the first and second precharge transistors PL5 and PL6. When the active load circuit 230 is turned on in response to activation of the enable signal ON, the first and second precharge transistors PL5 and PL6 are turned off.

Figure 4:
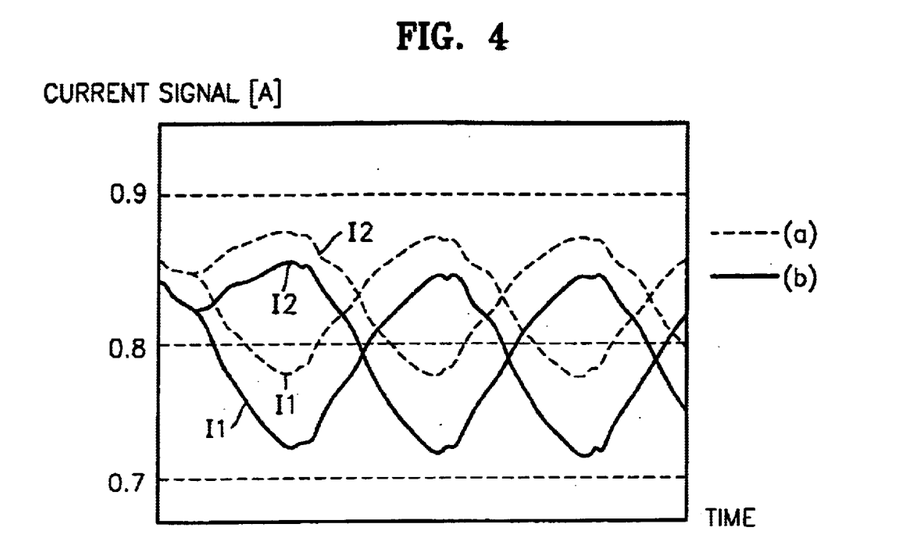
FIG. 4 is a waveform diagram of current signals sensed by a current sense amplifier in a conventional passive load circuit and in an active load circuit according to embodiments of the present invention.

FIG. 4 is a waveform diagram of current signals sensed by the current sense amplifier in a conventional passive load circuit and in active load circuits according to embodiments of the present invention. That is, in FIG. 4, (a) indicates current signals I1 and I2 of the current sense amplifier in the conventional passive load circuit of FIG. 1, and (b) indicates the current signals I1 and I2 of a current sense amplifier in an active load circuit according to embodiments of the present invention. As shown in FIG. 4, the difference in the levels of the current signals, i.e., I1–I2 is greater in (b) than in (a).

Figure 5:
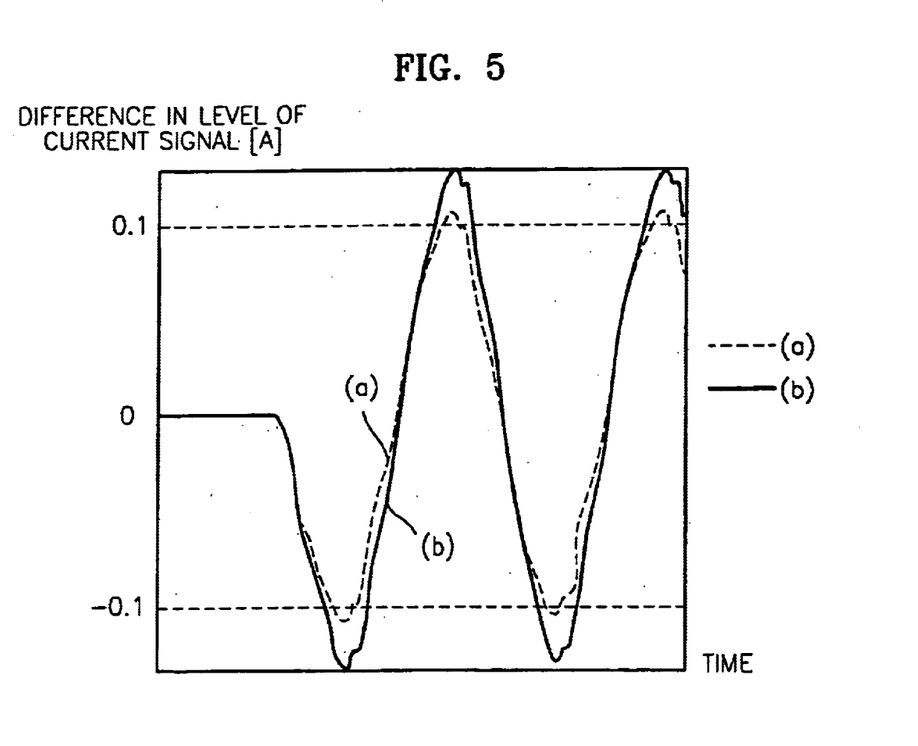
FIG. 5 is a graph of differences in levels of the current signals of the passive load circuit and the active load circuit of FIG. 4.

FIG. 5 is a graph of differences in the levels of the current signals, i.e., I1–I2, of (a) and (b) of FIG. 4. That is, in FIG. 5, (a) indicates a difference in the levels of the current signals I1 and I2, i.e., I1–I2, in the current sense amplifier in the conventional passive load circuit of FIG. 1 and (b) indicates a difference in the levels of the current signals I1 and I2, i.e., I1–I2, in a current sense amplifier in an active load circuit according embodiments of to the present invention.

As shown in FIG. 5, the amplitude of the difference is greater in (b) than in (a). As the difference of the current signals in the current sense amplifier is greater, the current sense amplifier can sense the data more easily, and thus reliability of the output data can be enhanced.

As described above, active load circuits according to embodiments of the present invention may enable the small current signal to be transmitted to the current sense amplifier through the pair of data lines with reduced loss of data on the current signal so that the current sense amplifier can more effectively sense and amplify the data output from the bit line sense amplifier. Accordingly, reliability of the output data of the semiconductor memory device can be enhanced.

According to embodiments of the present invention, a semiconductor memory device having an active load circuit may be capable of transmitting a current signal through a pair of data lines to a current sense amplifier more efficiently. According to embodiments of the present invention, a semiconductor memory device can include a bit line sense amplifier connected to a bit line to sense and amplify data of a memory cell, a pair of data lines that transmit output data from the bit line sense amplifier, a current sense amplifier that senses and amplifies data from the pair of data lines, and an active load circuit. The active load circuit includes a first load device that is electrically connected to a data line of the pair of data lines and in which current capacity can be controlled in response to a voltage level of the data line. The active load circuit also includes a second load device, that is electrically connected to a supplementary data line of the pair of data lines and in which current capacity can be controlled in response to a voltage level of the supplementary data line.

A turn-on resistance of the first load device can increase as the voltage level of the data line decreases, and a turn-on resistance of the second load device can increase as the voltage level of the supplementary data line decreases. The active load circuit may further include a first control transistor that generates a first control signal in response to the voltage level of the data line to control the first load device and a second control transistor that generates a second control signal in response to the voltage level of the supplementary data line to control the second load device.

According to other embodiments of the present invention, a semiconductor memory device can include a memory cell array in which a plurality of memory cells are disposed, a bit line sense amplifier that senses and amplifies data that is output from the memory cell array through a pair of bit lines, and a pair of data lines that transmits the data that is sensed and amplified by the bit line sense amplifier. The semiconductor memory device can also include a current sense amplifier connected to the pair of data lines, that senses and amplifies the data from the bit line sense amplifier, and an active load circuit that is connected to the pair of data lines. The active load circuit determines an operating point of the current sense amplifier, and the active load circuit includes a first load device electrically connected to a data line of the pair of data lines and in which current capacity can be controlled by a first control signal in response to a voltage level of the data line. The active load circuit also includes a second load device electrically connected to a complementary data line of the pair of data lines and in which current capacity can be controlled by a second control signal in response to a voltage level of the supplementary data line. A turn-on resistance of the first load device may increase as the voltage level of the data line decreases, and a turn-on resistance of the second load device may increase as the voltage level of the complementary data line decreases. The active load circuit may also include a first control transistor that generates the first control signal for controlling the first load device in response to the voltage level of the data line and a second control transistor that generates the second signal for controlling the second load device in response to the voltage level of the complementary data line. The current sense amplifier may sense and amplify a current signal which is transmitted to the current sense amplifier to be output.

In addition, the first load device can be a PMOS transistor connected between a first supply voltage and the data line and having a gate receiving the first control signal. The second load device can be a PMOS transistor connected between the first supply voltage and the complementary data line and having a gate receiving the second control signal. The first control transistor can be an NMOS transistor connected between a gate node of the first load device and a common node and having a gate connected to the data line, and the second control transistor can be an NMOS transistor connected between a gate node of the second load device and the common node and having a gate connected to the complementary data line.

The active load circuit may also include an operation control transistor connected between the common node and a second supply voltage wherein the operation control transistor is turned on or off in response to an enable signal.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. An integrated circuit memory device comprising:
a memory cell array including a plurality of memory cells;
a bit line sense amplifier configured to amplify data on a pair of bit lines from a memory cell of the memory cell array and to provide the amplified data on a data line and a complementary data line; and
an active load circuit including a first load device electrically connected between the data line and a first voltage source wherein an electrical resistance of the first load device is varied responsive to a voltage level of the data line, and a second load device electrically connected between the complementary data line and the first voltage source wherein an electrical resistance of the second load device is varied responsive to a voltage level of the complementary data line.

2. An integrated circuit memory device according to claim 1 wherein the electrical resistance of the first load device increases as the voltage level of the data line decreases and wherein the electrical resistance of the second load device increases as the voltage level of the complementary data line decreases.

3. An integrated circuit memory device according to claim 1 wherein the electrical resistance of the first load device decreases as the voltage level of the data line increases and wherein the electrical resistance of the second load device decreases as the voltage level of the complementary data line increases.

4. An integrated circuit memory device according to claim 1 wherein the first load device comprises a first load transistor connected between the data line and the first voltage source and wherein the second load device comprises a second load transistor connected between the complementary data line and the first voltage source.

5. An integrated circuit memory device according to claim 4 wherein the active load circuit further comprises a first control transistor configured to generate a first control signal responsive to the voltage level of the data line and a second control transistor configured to generate a second control signal responsive to the voltage level of the complementary data line with the first control signal being applied to a gate of the first load transistor and with the second control signal being applied to a gate of the second load transistor.

6. An integrated circuit memory device according to claim 5 wherein the active load circuit further comprises a first diode connected between the complementary data line and the first control transistor and a second diode connected between the data line and the second control transistor.

7. An integrated circuit memory device according to claim 6 wherein the first and second diodes comprise respective MOS transistors.

8. An integrated circuit memory device according to claim 5 wherein the first control transistor is connected between the gate of the first load transistor and a common node with a gate connected to the data line and wherein the second control transistor is connected between the gate of the second load transistor and the common node with a gate connected to the complementary data line.

9. An integrated circuit memory device according to claim 8 wherein the first and second control transistors comprise respective first and second NMOS transistors.

10. An integrated circuit memory device according to claim 8 wherein the active load circuit further comprises an operation control transistor connected between the common node and a second voltage source wherein the operation control transistor is configured to turn on responsive to an activated enable signal and to turn off responsive to a deactivated enable signal.

11. An integrated circuit memory device according to claim 10 further comprising a precharge device configured to precharge the first and second control signals to the first voltage source responsive to the deactivated enable signal.

12. An integrated circuit memory device according to claim 11 wherein the precharge device comprises a first precharge transistor connected between the first voltage source and the gate of the first load transistor with a gate receiving the enable signal and a second precharge transistor connected between the first voltage source and the gate of the second load transistor with a gate receiving the enable signal.

13. An integrated circuit memory device according to claim 10 wherein the first voltage source comprises a supply voltage and wherein the second voltage source comprises a ground voltage.

14. An integrated circuit memory device according to claim 4 wherein the first and second load devices comprise respective PMOS transistors.

15. An integrated circuit memory device according to claim 1 further comprising:
a current sense amplifier configured to amplify data from the data line and the complementary data line.

16. An integrated circuit memory device according to claim 1 further comprising:
transmission gates on the pair of complementary data lines configured to couple the bit line sense amplifier to the active load circuit responsive to an enabled selection signal and to decouple the bit line sense amplifier from the active load circuit responsive to a disabled selection signal.

17. A method of operating an integrated circuit memory device including an array of memory cells and a bit line sense amplifier configured to amplify data on a pair of bit lines from a memory cell of the array and to provide the amplified data on a data line and a complementary data line, the method comprising:
varying an electrical resistance between the data line and a voltage source responsive to a voltage level of the data line; and
varying an electrical resistance between the complementary data line and the voltage source responsive to a voltage level of the complementary data line.

18. A method according to claim 17 wherein varying the electrical resistance between the data line and the voltage source comprises increasing the electrical resistance between the data line and the voltage source as the voltage level of the data line decreases and wherein varying the electrical resistance between the complementary data line and the voltage source comprises increasing the electrical resistance between the complementary data line and the voltage source as the voltage level of the complementary data line decreases.

19. A method according to claim 17 wherein varying the electrical resistance between the data line and the voltage source comprises decreasing the electrical resistance between the data line and the voltage source as the voltage level of the data line increases and wherein varying the electrical resistance between the complementary data line and the voltage source comprises decreasing the electrical resistance between the complementary data line and the voltage source as the voltage level of the complementary data line increases.

20. A method according to claim 17 wherein varying the electrical resistance between the data line and the voltage source comprises generating a first control signal responsive to the voltage level of the data line with the electrical resistance between the data line and the voltage source being varied responsive to the first control signal and wherein varying the electrical resistance between the complementary data line and the voltage source comprises generating a second control signal responsive to the voltage level of the complementary data line with the electrical resistance between the complementary data line and the voltage source being varied responsive to the second control signal.

21. A method according to claim 20 further comprising:
precharging the first and second control signals to a voltage level of the voltage source responsive to a deactivated enable signal.

22. A method according to claim 17 wherein the voltage source comprises a supply voltage for the memory device.

23. A method according to claim 17 further comprising:
amplifying data from the data line and the complementary data line.

24. A method according to claim 17 further comprising:
coupling the bit line sense amplifier to the data line and the complementary data line responsive to an enabled selection signal; and
decoupling the bit line sense amplifier from the data line and the complementary data line responsive to a disabled selection signal.

* * * * *